United States Patent
Shibata et al.

(10) Patent No.: US 7,687,824 B2
(45) Date of Patent: Mar. 30, 2010

(54) METHOD OF IMPROVING SURFACE FLATNESS OF GROUP-III NITRIDE CRYSTAL, SUBSTRATE FOR EPITAXIAL GROWTH, AND SEMICONDUCTOR DEVICE

(75) Inventors: Tomohiko Shibata, Kasugai (JP); Keiichiro Asai, Nagoya (JP); Shigeaki Sumiya, Handa (JP)

(73) Assignee: NGK Insulators, Ltd., Nagoya-Shi (JP)

( * ) Notice: Subject to any disclaimer, the term of this patent is extended or adjusted under 35 U.S.C. 154(b) by 511 days.

(21) Appl. No.: 11/167,078

(22) Filed: Jun. 24, 2005

(65) Prior Publication Data
US 2005/0287774 A1    Dec. 29, 2005

(30) Foreign Application Priority Data

| Jun. 29, 2004 | (JP) | 2004-192134 |
| Nov. 12, 2004 | (JP) | 2004-329443 |
| Apr. 28, 2005 | (JP) | 2005-132721 |
| Jun. 8, 2005 | (JP) | 2005-168463 |

(51) Int. Cl.
H01L 29/24 (2006.01)

(52) U.S. Cl. .............. 257/103; 257/189; 257/615; 257/E31.04

(58) Field of Classification Search .......... 438/478, 438/507, 509, 46; 257/103, 189, 613, 615, 257/E31.04
See application file for complete search history.

(56) References Cited

U.S. PATENT DOCUMENTS

| 6,707,076 B2 * | 3/2004 | Hori et al. ............ 257/194 |
| 6,749,957 B2 * | 6/2004 | Shibata et al. .......... 428/698 |
| 6,841,410 B2 * | 1/2005 | Sasaoka ............... 438/47 |
| 2002/0017696 A1 * | 2/2002 | Nakayama et al. ........ 257/471 |
| 2002/0190275 A1 * | 12/2002 | Shibata et al. .......... 257/200 |
| 2003/0170503 A1 * | 9/2003 | Shibata et al. .......... 428/698 |

FOREIGN PATENT DOCUMENTS

| JP | 05-041541 A1 | 2/1993 |
| JP | 3455512 | 7/2003 |
| JP | 2004-137142 | 5/2004 |
| JP | 2004-152814 A1 | 5/2004 |

OTHER PUBLICATIONS

Akira Sakai and Akira Usui, "Reduction of dislocation density in GaN films by epitaxial lateral overgrowth," "Oyo Buturi," The Japan Society of Applied Physics, vol. 68, No. 7, pp. 774-779 (1999) and its English Abstract.

* cited by examiner

Primary Examiner—Michael Trinh
(74) Attorney, Agent, or Firm—Burr & Brown

(57) ABSTRACT

A heating process is performed in a nitrogen atmosphere at a temperature of not less than 1650° C. upon an epitaxial substrate including a single crystal base and an upper layer made of a group-III nitride crystal and epitaxially formed on a main surface of the single crystal base. The result shows that the heating process reduces the number of pits in a top surface to produce the effect of improving the surface flatness of the group-III nitride crystal. The result also shows that the dislocation density in the group-III nitride crystal is reduced to not more than one-half the dislocation density obtained before the heat treatment.

11 Claims, 6 Drawing Sheets

| | | AlN FILM THICKNESS (μm) | BEFORE HEAT TREATMENT ||||| HEAT TREATMENT CONDITIONS | AFTER HEAT TREATMENT |||||
|---|---|---|---|---|---|---|---|---|---|---|---|---|---|
| | | | X-RAY RC FWHM (0002) PLANE (sec) | X-RAY RC FWHM (10-12) PLANE (sec) | DISLOCATION DENSITY (/cm²) | ra (Å) | PIT | | X-RAY RC FWHM (0002) PLANE (sec) | X-RAY RC FWHM (10-12) PLANE (sec) | DISLOCATION DENSITY (/cm²) | ra (Å) | PIT |
| INVENTIVE EXAMPLE 1 | (a) | 1 | 70 | 1100 | 2×10¹⁰ | 3 | PRESENT | 1650°C, 2hr | 70 | 700 | 5×10⁹ | 3 | ABSENT |
| | (b) | | | | | | | 1550°C, 2hr | 70 | 700 | 5×10⁹ | 3 | ABSENT |
| | (c) | | | | | | | 1450°C, 2hr | 70 | 700 | 5×10⁹ | 150 | ABSENT |
| INVENTIVE EXAMPLE 2 | (a) | 0.2 | 90 | 2000 | 5×10¹⁰ | 30 | PRESENT | 1650°C, 2hr | 150 | 750 | 5×10⁹ | 3 | ABSENT |
| | (b) | | | | | | | 1550°C, 2hr | 110 | 900 | 8×10⁹ | 30 | PRESENT |
| | (c) | | | | | | | 1450°C, 2hr | 70 | 1300 | 2×10¹⁰ | 40 | ABSENT |
| INVENTIVE EXAMPLE 3 | (a) | 1 | 95 | 900 | 8×10⁹ | 3 | PRESENT | 1650°C, 15hr | 70 | 350 | 9×10⁸ | 3 | ABSENT |
| | (b) | | 70 | 1200 | 2×10¹⁰ | 3 | PRESENT | 1650°C, 15hr | 70 | 500 | 2×10⁹ | 4 | ABSENT |
| | (c) | | 70 | 6000 | 3×10¹¹ | 3 | PRESENT | 1650°C, 15hr | 70 | 6000 | 3×10¹¹ | 3 | PRESENT |
| COMPARATIVE EXAMPLE 1 | (a) | 1 | 70 | 1100 | 2×10¹⁰ | 3 | PRESENT | 1200°C, 2hr | UNCHANGED FROM BEFORE HEAT TREATMENT ||||
| | (b) | 0.2 | 90 | 2000 | 5×10¹⁰ | 3 | PRESENT | 1200°C, 2hr | UNCHANGED FROM BEFORE HEAT TREATMENT ||||
| COMPARATIVE EXAMPLE 2 | (a) | 1 | 70 | 1100 | 2×10¹⁰ | 3 | PRESENT | 1750°C, 2hr | >500 | >3000 | | >50nm | |
| | (b) | 0.2 | 90 | 2000 | 5×10¹⁰ | 3 | PRESENT | 1750°C, 2hr | >500 | >3000 | | >50nm | |

METHOD OF IMPROVING SURFACE FLATNESS OF GROUP-III NITRIDE CRYSTAL, SUBSTRATE FOR EPITAXIAL GROWTH, AND SEMICONDUCTOR DEVICE

BACKGROUND OF THE INVENTION

1. Field of the Invention

The present invention relates to a technique for improving the crystal quality of a group-III nitride crystal and, more particularly, to a technique for improving the flatness of a crystal surface.

2. Description of the Background Art

A group-III nitride crystal has been used as a material constituting a semiconductor device such as a photonic device and an electronic device, and has gained the spotlight in recent years as a semiconductor material constituting a rapid IC chip for use in a portable telephone. In particular, an AlN film has received attention as a material for application to a field emitter.

For such device applications, a group-III nitride crystal is ideally provided as free-standing one. Under the current circumstances, however, a group-III nitride crystal is typically provided in the form of a so-called epitaxial substrate such that the group-III nitride crystal having a thickness of the order, at most, of 10 μm (to such a degree that no warpage resulting from a difference in coefficient of thermal expansion occurs) is epitaxially formed on a predetermined single crystal base because of problems with crystal quality, manufacturing costs and the like. In general, thin film formation methods such as an MOCVD (metal-organic chemical vapor deposition) process and an MBE (molecular beam epitaxy) process are used to form such an epitaxial substrate.

In the epitaxial substrate having such a construction, however, a difference in lattice constant exists between the base and the group-III nitride crystal to give rise to dislocations resulting from such a lattice mismatch at an interface therebetween. Such dislocations thread through the group-III nitride film serving as a device functional layer, and most of the dislocations propagate to the surface thereof. To attain good device characteristics, there is a need to minimize the dislocations propagating to the device functional layer.

An ELO process has been proposed to improve the crystal quality resulting from the lattice mismatch between the base and the group-III nitride crystal. See, for example, Akira Sakai and Akira Usui, "Reduction of dislocation density in GaN films by epitaxial lateral overgrowth," "OYO BUTURI," The Japan Society of Applied Physics, Vol. 68, No. 7, pp. 774-779 (1999). The process utilizes an epitaxial lateral overgrowth technique using a mask and the like to reduce a dislocation density.

Selective area growth can not be expected when the above-mentioned group-III nitride crystal is composed of AlN. To solve the problem, a technique for reducing the number of dislocations using the ELO process using the base with a shaped surface (as disclosed, for example, in Japanese Patent No. 3455512) and a method of forming AlN with a small number of dislocations by directly nitriding a sapphire substrate (as disclosed, for example, in Japanese Patent Application Laid-Open No. 2004-137142) have been proposed.

It is necessary to improve the crystal quality as much as possible in order to increase the performance of a functional device when a group-III nitride crystal is formed on a base for the function as the functional device. For instance, when an epitaxial substrate is used for a functional device, it is typical that a single crystal layer is further formed on the epitaxial substrate. The good crystal quality of the single crystal layer requires the good flatness of the surface of the group-III nitride crystal constituting the epitaxial substrate. The good flatness of the surface as used herein shall mean, for example, the absence of pits, low surface roughness (preferably, a flat surface at the atomic level), and the like.

It is also necessary to minimize the dislocation density. The reduction in dislocation density promises to achieve, for example, an increase in light emitting efficiency for a light-emitting device, a decrease in dark current for a photodetector device, and an increase in mobility for an electronic device.

The above-mentioned background art techniques can achieve the reduction in the number of dislocations, but are not intended to improve the surface flatness.

SUMMARY OF THE INVENTION

The present invention is intended for a technique for improving the crystal quality of a group-III nitride crystal and, more particularly, for a technique for improving the flatness of a group-III nitride crystal formed in a surface of an epitaxial substrate.

According to the present invention, a substrate for epitaxial growth comprises: a predetermined single crystal base; and an upper layer made of a group-III nitride crystal and epitaxially formed on the single crystal base, the substrate for epitaxial growth being subjected to a heating process after the formation of the upper layer, the heating process being performed at a heating temperature higher than a temperature at which the group-III nitride crystal is formed.

The execution of the heating process achieves an improvement in the flatness of the crystal surface of the epitaxially formed group-III nitride. As an example, the improvement in the surface flatness due to the elimination of pits is achieved, as compared with the surface obtained before the method of the present invention is performed. Additionally, there is no need for special limitations on the condition settings and control of the deposition itself of the group-III nitride crystal during the heating process.

Preferably, the heating temperature is not less than 1500° C.

This achieves the reduction in dislocation density as well as the improvement in the flatness of the crystal surface due to the elimination of pits when the group-III nitride crystal has a thickness of not less than about 0.5 μm.

More preferably, the heating temperature is not less than 1600° C.

This achieves the reduction in dislocation density as well as the improvement in the flatness of the crystal surface such as the elimination of pits and an improvement in surface roughness when the group-III nitride crystal has a thickness of not less than about 0.005 μm.

It is therefore an object of the present invention to provide a method of easily achieving an improvement in surface flatness of an epitaxially formed group-III nitride crystal.

These and other objects, features, aspects and advantages of the present invention will become more apparent from the following detailed description of the present invention when taken in conjunction with the accompanying drawings.

DESCRIPTION OF THE PREFERRED EMBODIMENTS

A semiconductor device employing a group-III nitride semiconductor material is provided by epitaxially forming a semiconductor device layer serving as a functional layer of the semiconductor device on an epitaxial substrate. Raising the quality of the epitaxial substrate serving as an underlying substrate is effective for improvements in crystal quality. A method of improving the flatness of a crystal surface according to a preferred embodiment of the present invention to be described hereinbelow is a method for achieving the higher quality of such an epitaxial substrate.

Specifically, suppressing the degradation of the surface flatness due to the formation of pits and the like in the surface of the epitaxial substrate inhibits the recurrence of dislocations at an interface between the epitaxial substrate and the semiconductor device layer. As for the surface roughness of the epitaxial substrate, it is desirable to achieve such flatness that an atomic step is clearly observed. Specifically, it is desirable that the surface roughness (ra) in a 5-by-5-μm square region by AFM measurement be not more than 10 Å. Otherwise it is desirable that the number of pits in a 5-by5 μm square region by the AFM measurement be not more than one. The method of improving the flatness according to the present invention further produces the effect of reducing the density of threading and remaining dislocations by reducing the dislocation density of the epitaxial substrate.

Figure 1:
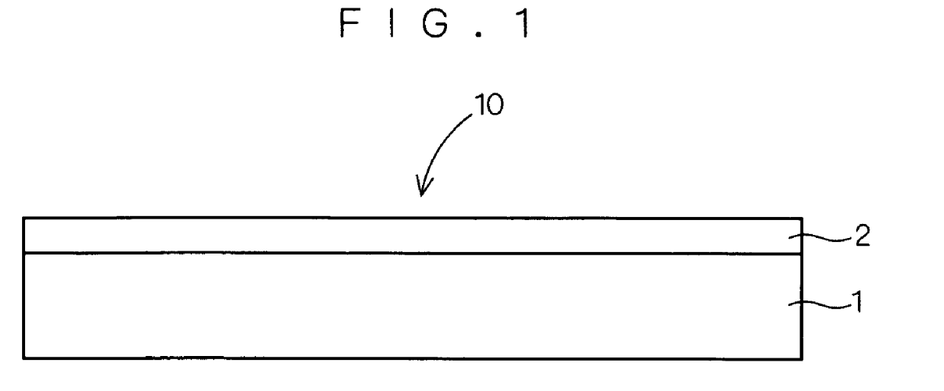
FIG. 1 is a schematic sectional view showing the construction of an epitaxial substrate.

FIG. 1 is a schematic sectional view of an epitaxial substrate 10 including an upper layer 2 made of a group-III nitride crystal to which the method of improving the flatness of the crystal surface according to the preferred embodiment of the present invention is applied. For purposes of illustration, the thicknesses and aspect ratios of respective layers shown in FIG. 1 are not drawn to scale.

The upper layer 2 is formed on a base 1 made of a single crystal material different in composition from the group-III nitride crystal. The upper layer 2 is an epitaxial film made of the group-III nitride crystal and formed by a known deposition technique such as an MOCVD process, an MBE process, an HVPE process (a vapor-phase epitaxy process using hydride), and a sputtering process. The MOCVD process may be used in combination with a PALE (Pulsed Atomic Layer Epitaxy) process, a plasma assisted process or a laser assisted process. The MBE process may also be used in combination with similar techniques. The growth methods such as the MOCVD process and the MBE process, which are capable of controlling the manufacturing conditions with high accuracy, are suitable for the growth of a high-quality crystal. The HVPE process, on the other hand, is suitable for the growth of a thick film in a short time because this process can supply a large amount of raw material at a time. These processes may be combined together during the formation of the upper layer 2.

In general, the upper layer 2 contains dislocations having a density of about $1 \times 10^9/cm^2$ or higher. For the group-III nitride crystal, there can be two types of dislocations: screw dislocations and edge dislocations. The edge dislocations are principally present in the upper layer 2. The group-III nitride crystal refers to a crystal with a composition represented by $B_xAl_yGa_zIn_{1-x-y-z}N$ (where x, y, z≧0) and having a wurtzite structure or a zincblende structure. The thickness of the upper layer 2 is not particularly limited, but is selected so as to be optimum for a device structure to be used finally or for type of usage. For example, the thickness of the upper layer 2 ranging from about several nanometers to about several millimeters is assumed. The composition of the upper layer 2 illustrated herein is an average composition, and need not always be throughout homogeneous. For example, a gradually varying composition may be employed as the composition of the upper layer 2 or a stress relaxation layer having a different composition may be inserted into the upper layer 2.

Impurities such as H, C, O, Si and transition metals inevitably contained in the upper layer 2 during the formation of the upper layer 2 are sometimes present in the upper layer 2. The upper layer 2 may contain impurities such as Si, Ge, Be, Mg, Zn and Cd intentionally introduced into the upper layer 2 for the purpose of electrical conductivity control.

The material of the base 1 is appropriately selected in accordance with the composition and structure of the upper layer 2 to be formed thereon or the technique of forming the upper layer 2 and layers to be formed on the upper layer 2. For example, a substrate of SiC (silicon carbide) or sapphire is used as the base 1. Alternatively, the material of the base 1 may be appropriately selected from the group consisting of: oxide materials such as ZnO, $LiAlO_2$, $LiGaO_2$, $MgAl_2O_4$, $(LaSr)(AlTa)O_3$, $NdGaO_3$ and MgO; group-IV single crystals such as Si and Ge; IV-IV compounds such as SiGe; III-V compounds such as GaAs, AlN, GaN and AlGaN; and single crystals of borides such as $ZrB_2$. Of these materials, for example, (0001) SiC, or (11-20) and (0001) sapphire may be used as the material of the base 1 when a group-III nitride crystal having a main surface coincident with the (0001) plane thereof is provided as the upper layer 2. For example, (11-20) SiC or (10-12) sapphire may be used as the material of the base 1 when a group-III nitride crystal having a main surface coincident with the (11-20) plane thereof is provided as the upper layer 2. There are no special material limitations on the thickness of the base 1, but the base 1 having a thickness ranging from hundreds of micrometers to several millimeters is preferable for convenience of handling.

In this preferred embodiment, a predetermined processing apparatus performs heat treatment for heating the epitaxial substrate 10 at least to not less than 1250° C., preferably not less than 1600° C., to achieve the improvement in the crystal quality of the group-III nitride crystal constituting the upper layer 2. When the upper layer 2 is formed as the epitaxial film as shown in FIG. 1, such heat treatment is effective especially for the reduction in the number of dislocations and the elimination of pits in the surface. For example, the dislocation density is reduced to about half or lower. In particular, the edge dislocations may be combined together to disappear effectively by the heat treatment.

The elimination of pits is achieved by heating to a temperature of not less than 1250° C. when the thickness of the upper layer 2 is somewhat thick, for example about 0.5 μm or thicker. Within a temperature range below 1500° C., however, the surface roughness becomes rather worse to exhibit an insufficient result from the viewpoint of the improvement in surface flatness. Heating at a temperature of not less than 1500° C. is required to provide a good crystal surface.

On the other hand, heat treatment at a temperature of not less than 1600° C. is required to achieve both the elimination of pits and the improvement in surface roughness when the thickness of the upper layer 2 ranges from about 0.005 μm to 0.5 μm, for example about 0.2 μm. If the upper layer 2 is thin, significant degradation of the surface flatness is induced by the formation of three-dimensional nuclei due to a lattice mismatch between the upper layer 2 and the base 1 when the epitaxial film made of the group-III nitride crystal is formed as the upper layer 2. Hence it is considered to be necessary to raise the heat treatment temperature to not less than 1600° C. to promote the effect of mass transfer. Of course, the upper layer 2 having a thickness of not less than 0.5 μm also produces this effect to allow the elimination of pits more effectively. Therefore, heat treatment at a temperature of not less than 1600° C. for the upper layer 2 having a thickness of not less than 0.5 μm is not excluded from the present invention.

The heating temperature is at least not less than 1250° C. for the following reason. Heating at a temperature of not less than 1250° C. produces at least the effect of reducing the number of dislocations because the temperature of a substrate itself is typically not more than 1250° C. during the formation of the upper layer 2 by a MOCVD process and the like. In general, a deposition technique such as the MOCVD process is a technique for forming a film by using a non-equilibrium reaction. Thus, a greater number of crystal defects (such as dislocations) than those existing in a state of thermal equilibrium are considered to exist in a kind of frozen-like state in the epitaxial film on the base 1. It can be inferred that heating to a temperature of not less than 1250° C. causes the state of thermal equilibrium to be approached, thereby reducing the number of dislocations. This is not intended to limit the deposition temperature using the MOCVD process to not more than 1250° C., but the deposition may be performed at a temperature of not less than 1250° C. For a group-III nitride containing Al as a principal component, particularly for AlN, it is supposed to increase the deposition temperature using the MOCVD process to not less than 1250° C. Even when the deposition is performed at a substrate temperature of not less than 1250° C., the execution of the heating process at a temperature not less than the substrate temperature produces the effect of the method of improving the flatness according to the preferred embodiment.

The improvement in crystal quality by such a heating process according to the preferred embodiment is especially effective when the group-III nitride has an Al content of not less than 80 mole percent of all of the group-III elements and is, among others, effective for AlN. The use of AlN as the group-III nitride is most desirable in the light of quality management because AlN presents no problems of variations resulting from compositional inhomogeneity and the like. It is, however, ascertained that the group-III nitride having an Al content of not less than 80 mole percent of all of the group-III elements produces a similar crystal quality improvement effect in the heating process at the same temperature as the heating process for AlN. Also, such a group-III nitride provides the quality of the upper layer 2 before the heating process which is substantially identical with the quality obtained when AlN is used. If the group-III nitride having an Al content of less than 80 mole percent of all of the group-III elements is subjected to the heating process at the same temperature as the heating process for AlN, there arises a problem that the evaporation of other group-III elements, for example a Ga component, creates pits to impair the surface flatness in some cases.

An attempt to suppress crystal defects by carrying out the formation itself of the upper layer 2 using the epitaxial layer of the group-III nitride crystal at an elevated temperature as high as that for the heat treatment of the preferred embodiment makes it generally difficult to set epitaxial growth conditions and to control the deposition because this attempt is required to appropriately maintain the epitaxial growth conditions while suppressing the crystal defects. The preferred embodiment of the present invention, on the other hand, prepares the epitaxial film of the group-III nitride crystal in some manner and thereafter heats the epitaxial film to a temperature higher than the film making temperature (deposition temperature). The preferred embodiment, therefore, has the advantage of providing the group-III nitride crystal of good quality without the need for special limitations on the condition settings and control of the deposition itself.

The heat treatment according to the preferred embodiment may follow close on the formation of the group-III nitride in the same processing apparatus. Alternatively, the formation of the group-III nitride and the heat treatment may be performed in separate processing apparatuses, respectively. The latter is advantageous in being able to perform the deposition process and the heating process in separate apparatuses suitable for the respective processes.

It is desirable that an atmosphere during the heat treatment be an atmosphere containing element nitrogen to prevent the decomposition of the group-III nitride. For example, an atmosphere containing a nitrogen gas and an ammonia gas may be used. Regarding pressure conditions during the heat treatment, it is ascertained that the crystal quality is improved when any level of pressure ranging from a reduced pressure to an increased pressure may be used.

The method of improving the crystal surface flatness according to the preferred embodiment utilizes the regularity of the crystalline array of the base 1 made of the single crystal to improve the crystal quality of the upper layer 2 formed on the base 1. To this end, it is desirable that the material used for the base 1 be a material which is neither decomposed nor melted in a temperature range of the heat treatment performed for the improvement in crystal quality or which does not react strongly with the group-III nitride crystal constituting the upper layer 2. This is because there is a need to avoid the occurrence of the disorder in the crystalline array of the base 1 during the heat treatment. It is hence desirable that a reaction product of the base 1 and the upper layer 2 be not remarkably formed at the interface between the base 1 and the upper layer 2 during the heat treatment. The "reaction product not remarkably formed" specifically means that no reaction products are present at the interface between the base 1 and the upper layer 2 after the heat treatment or that the reaction product, if any, has a thickness of, at most, not more than one-tenth the thickness of the upper layer 2. This is because the thickness exceeding this value creates a likelihood that the surface flatness of the upper layer 2 is impaired due to the presence of the reaction product. Thus, the formation of the entire or local ultrathin reaction product at the interface between the base 1 and the upper layer 2 by heat treatment is not excluded from the present invention. In some cases, the presence of such an ultrathin reaction product is rather preferable because the reaction product functions as a buffer layer for reduction in the number of dislocations and the like. From this viewpoint, sapphire, MgO and SiC which have a high melting point are desirable as the material of the base 1.

It is therefore desirable to perform the heat treatment in a temperature range not exceeding the melting point of the base 1 or in a temperature range in which the reaction product of the base 1 and the upper layer 2 is not remarkably formed, that is, in which the degradation of the crystal quality of the upper layer 2 does not occur due to an excessive reaction. In particular, when sapphire is used for the base 1 and the upper layer 2 is formed of a group-III nitride containing Al, the heat treatment is preferably performed in a temperature range in which γ-ALON is not remarkably formed at the interface between the base 1 and the upper layer 2. This is because the remarkable formation of γ-ALON increases the surface roughness of the upper layer 2 to present difficulties in device applications.

For optical device applications in the ultraviolet region, it is desirable to use a material transparent to light of an operating wavelength, and sapphire is most preferable as the material of the base 1 in the light of compatibility with the crystal structure of the group-III nitride. For applications to high-power optical devices and to electronic devices requiring a heat dissipation property, it is most preferable to use SiC having a high thermal conductivity.

To produce the effect of reducing the number of dislocations in addition to the improvement in surface flatness when performing the heat treatment according to the preferred embodiment, longer heat treatment time is desirable because the heat treatment aims at a state of thermal equilibrium. However, to avoid the degradation of the surface flatness due to excessive heat treatment, it is necessary to appropriately set the heat treatment time in accordance with the thickness of the upper layer 2.

In the light of the stability of the crystal structure against heating, it is more effective that the method of improving the crystal quality according to the preferred embodiment is applied to the group-III nitride crystal having a wurtzite structure.

The higher the content of Al in the group-III nitride crystal is, the more effectively the crystal quality is improved. Such an effect is most remarkable for AlN. This is because a group-III nitride containing a large amount of Al has a higher melting point than GaN and InN which are also group-III nitrides and is less susceptible to the crystal quality degradation due to thermal decomposition, thereby to be able to utilize the effect of improving the crystal quality at elevated temperatures most effectively. The technique of the preferred embodiment can be applied to a group-III nitride containing a large amount of B because BN has a high melting point. It is, however, difficult for the group-III nitride containing a large amount of B to exert a remarkable effect because BN itself cannot take on a wurtzite structure as a stable crystal structure.

In particular, when the upper layer 2 is formed as an epitaxial layer made of a group-III nitride having a main surface coincident with the (0001) plane thereof, the effect of reducing the number of dislocations is remarkably produced, and such flatness that an atomic step can be observed is achieved at the surface of the epitaxial substrate 10 after the heat treatment. The use of (0001) sapphire, (11-20) sapphire and (0001) SiC as the material of the base 1 is preferable to form the upper layer 2 as the epitaxial film having such a main surface. In such cases, substrates with the above-mentioned planes slightly inclined from the main surfaces thereof may be used.

In particular, when an AlN epitaxial film having a main surface coincident with the (0001) plane thereof is used as the upper layer 2, the FWHM (full width at half maximum) for the (0002) plane by X-ray rocking curve measurement (ω scan) for the upper layer 2 before the heat treatment is preferably not more than 200 seconds, and more preferably not more than 100 seconds. The lower limit of the FWHM for the (0002) plane by the X-ray rocking curve measurement (ω scan) is not particularly determined, but does not fall below a theoretical value (10 seconds or lower) calculated from the material and crystal structure. The attainment of such an FWHM means small fluctuations in growth orientation, aligned C planes and reduced dislocations of spiral components at the surface of the upper layer 2. This is more preferable in forming a second group-III nitride crystal of good crystal quality on the upper layer 2. To attain the above-mentioned X-ray rocking curve FWHM, it is not desirable to insert a so-called low-temperature buffer layer on the base 1, but the insertion of a low-temperature buffer layer too thin to degrade the crystal quality is permitted.

When the AlN epitaxial film having the main surface coincident with the (0001) plane thereof is used as the upper layer 2, it is desirable that the edge dislocation density in the upper layer 2 before the heat treatment be not more than $5 \times 10^{10}/cm^2$ which is a lower value for the AlN epitaxial film. In this preferred embodiment, the dislocation density is evaluated by using plan view TEM. The formation of a nitride layer on the surface of the base 1 reduces the dislocation density of AlN before the heat treatment to the lower value as described above. This is because the reduction in the dislocation density before the heat treatment achieves the faster and more effective improvement in crystal quality by the heat treatment. Depending on the condition settings, the dislocation density of the upper layer 2 before the heat treatment may be reduced to about $1 \times 10^9/cm^2$.

The MOCVD process or the MBE process in which a growth rate is several micrometers per hour at the most can be said to be a preferable technique for forming the AlN epitaxial film having the main surface coincident with the (0001) plane thereof with such crystal quality as the upper layer 2. In this case, the thickness of the upper layer 2 is preferably not more than 10 μm, more preferably not more than 3 μm, considering the efficiency of growth time and the like. To form the upper layer 2 as described above in particular by the MOCVD process using trimethylaluminum and ammonia, it is desirable that the temperature of the substrate itself be not less than 1100° C. This is because a state closer to a state of equilibrium is achieved by reducing the growth rate to a low value and raising the temperature of the substrate itself. A reduced-pressure atmosphere is used in which the pressure during the growth is not less than 1 Torr, preferably not more than 100 Torr, more preferably not more than 20 Torr. It is also desirable that a supply ratio between trimethylaluminum and ammonia be not more than 1:500, more preferably not more than 1:200. This can efficiently suppress the reactions of raw materials in a vapor phase.

The crystal structure of AlN constituting the upper layer 2 and taking on a wurtzite structure as described above has no center of symmetry, and the orientation of the crystal of such AlN is reversed if an Al atom and a nitride atom change their places. In other words, the crystal has a polarity dependent on the arrangement of atoms. If inversion domains which are regions different in polarity from each other are present in the surface of the upper layer 2, the boundary of the inversion domains (an inversion domain boundary) functions as a kind of plane defect. In this case, there is a possibility that a defect resulting from this plane defect occurs after the heat treatment, which is undesired. Thus, the surface of the upper layer 2 preferably has the same polarity throughout.

In particular, when AlN is used for the epitaxial film serving as the upper layer 2, it is characteristic that the above-mentioned effect of reducing the number of dislocations is found not only in a surface portion but also in a nearby area about 0.01 μm from the interface of the base 1 and the group-III nitride epitaxial film to the same degree as in the surface portion. This results from the fact that a plurality of edge dislocations near the interface with the substrate are combined together to disappear by the heat treatment. This stands in contrast to the gradual decrease in dislocation density of the AlN epitaxial film serving as the upper layer 2 with the increasing thickness in the case where the improvement method according to the preferred embodiment is not used.

In view of such decrease in the number of dislocations, the production of the effects of not only improving the surface flatness but also reducing the dislocation density for the epitaxial substrate 10 including the AlN epitaxial film as the upper layer 2 requires the upper layer 2 having a thickness of not less than 5 nm such that the combined disappearance of the edge dislocations is substantially stopped. Preferably, the thickness of the upper layer 2 is not less than 0.05 μm, considering the decrease in thickness because of etching of the AlN epitaxial film during the heat treatment.

A member for controlling impurities in a gas such as a hydrogen component, an oxygen component and a carbon component may be provided within a processing apparatus for use in the heating process. Also, a tool for fixing the epitaxial substrate 10 may have this function.

A protective layer made of, for example, silicon nitride may be provided on the surface of the upper layer 2 for purposes of suppressing the etching of the surface of the upper layer 2 and suppressing the surface roughening due to the deposition of impurities and excessive heat treatment during the heating process. However, when in particular an AlN epitaxial film is used as the upper layer 2, the effect of the heat treatment is produced with stability without the use of the above-mentioned protective layer because of the chemical stability of the AlN epitaxial film.

When a semiconductor device is provided by forming a semiconductor layer serving as a functional layer made of a group-III nitride on the epitaxial substrate 10 according to the preferred embodiment, a lattice constant in the main surface of the group-III nitride constituting the above-mentioned semiconductor layer is preferably not less than a lattice constant in the main surface of the group-III nitride constituting the upper layer 2. If this condition is satisfied, cracks are suppressed in the semiconductor layer, and the semiconductor device having the semiconductor layer of higher quality is provided. However, an increasing lattice constant difference creates a likelihood that dislocations are formed at the interface between the group-III nitrides constituting the upper layer 2 and the semiconductor layer. It is therefore desirable that the lattice constant in the main surface of the group-III nitride constituting the semiconductor layer be not more than a lattice constant in the main surface of a layer of GaN; more preferably not more than a lattice constant in the main surface of a layer of $Al_{0.2}Ga_{0.8}N$; most preferably not more than a lattice constant in the main surface of a layer of $Al_{0.5}Ga_{0.5}N$.

<Modifications>

Although the upper layer 2 is formed as the epitaxial film in the above-mentioned preferred embodiment, the upper layer 2 may be formed as a polycrystalline film. Alternatively, the upper layer 2 may be formed by placing a group-III nitride crystal in powder form on the base 1. In these modifications, the formation of the upper layer 2 especially using the group-III nitride crystal in powder form has disadvantages not only in providing substantially lower crystal quality than the epitaxial film but also in the occurrence of grain boundaries and voids in addition to crystal defects, but can be said to produce effects similar to those of the above-mentioned preferred embodiment in that the crystal quality of the upper layer 2 is improved by the heat treatment. It goes without saying that the use of the epitaxial substrate with the crystalline array already aligned is more preferred in being able to reduce the dislocation density in a short time than the modifications in which the polycrystalline powder is placed and the polycrystalline film is formed.

The base 1 need not be entirely formed of the same material, but is required only to have the surface made of a single crystal on which the upper layer 2 is formed. For instance, an AlN single crystal film formed on sapphire may be used as the base 1 whereas an AlN powder be formed as the upper layer 2.

Although the above-mentioned preferred embodiment features the group-III nitride crystal formed as the upper layer 2 in the epitaxial substrate 10 as illustrated in FIG. 1, a similar effect is produced when the heat treatment according to the preferred embodiment is performed on a crystal made of only a group-III nitride without employing the base 1.

The surface of the base 1 may be of a variety of configurations. The surface of the base 1 may be flat at the atomic level or be formed with asperities on the order of submicrons to microns. Such asperities may be formed by using a micro-processing process. Further, a coating film for covering part of the surface of the base 1 or the like may be formed similarly by a micro-processing process or heat treatment. Moreover, surface reforming using a plasma process, a photochemical process and a cleaning process may be added before the growth of the upper layer 2.

For the formation of a second group-III nitride crystal on the upper layer 2, the surface of the upper layer 2 may be processed into a variety of configurations. The surface of the upper layer 2 may be formed with asperities on the order of submicrons to microns. Such asperities may be formed by using a micro-processing process. Further, a coating film for covering part of the surface of the upper layer 2 or the like may be formed similarly by a micro-processing process or heat treatment. Moreover, surface reforming using a plasma process, a photochemical process and a cleaning process may be added before the growth of the second group-III nitride.

EXAMPLES

Figure 7:
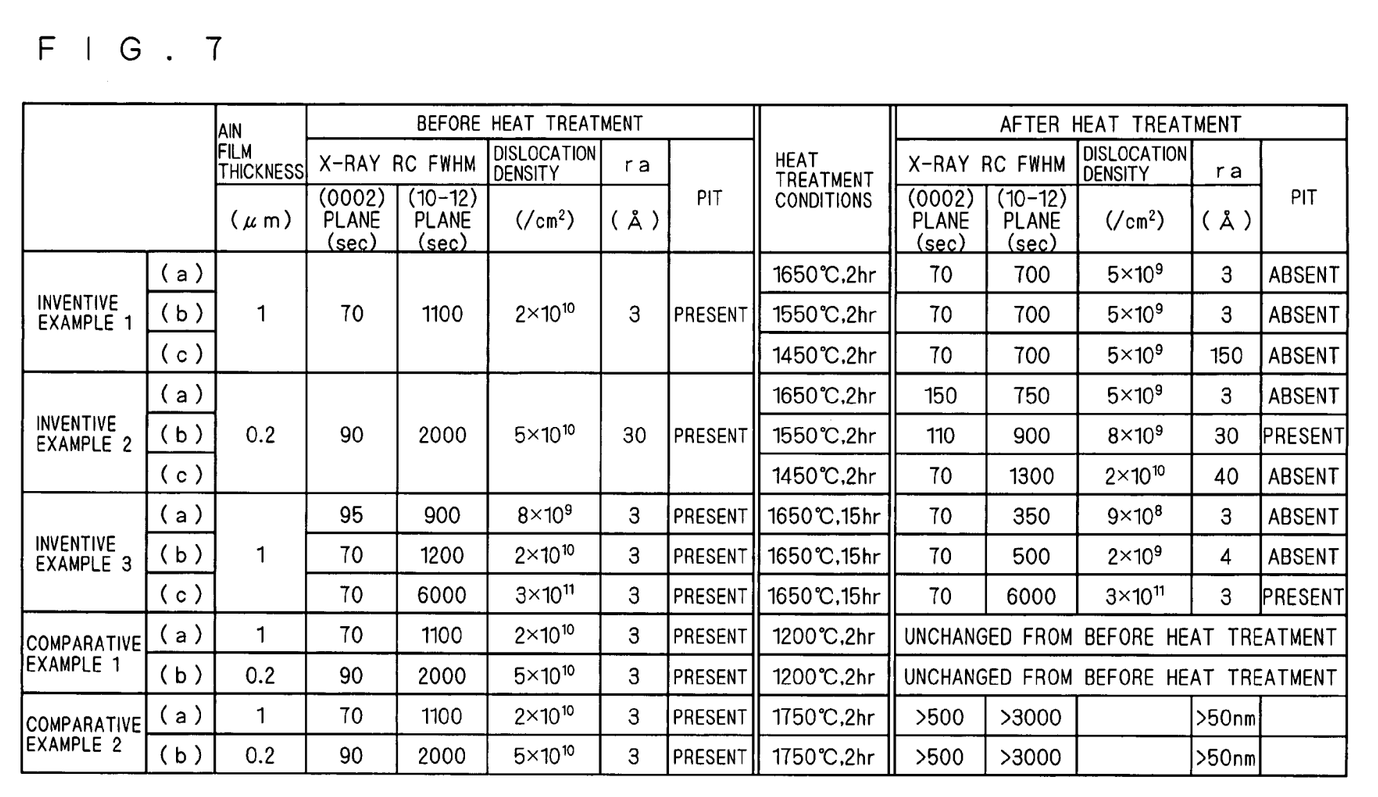
FIG. 7 shows a table providing a listing of specific treatment conditions and quality characteristics of epitaxial substrates in inventive examples and comparative examples.

Inventive examples and comparative examples will be described according to the above-mentioned preferred embodiment. FIG. 7 shows a table providing a listing of specific making and processing conditions and quality characteristics of epitaxial substrates obtained in the examples. Description will be given hereinafter based on the table of FIG. 7.

Inventive Example 1

Figure 2:
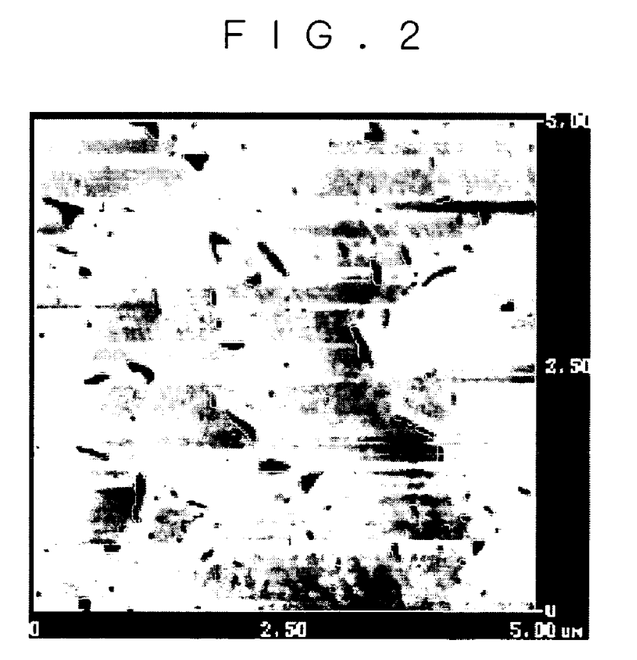
FIG. 2 shows a surface of an epitaxial substrate before heat treatment according to Inventive Example 1.

In Inventive Example 1, three epitaxial substrates 10 were obtained each by forming a (0001) AlN layer as the upper layer 2 having a thickness of 1 μm on (0001) sapphire as the base 1 at a temperature of 1200° C. by a MOCVD process. A base nitride layer is inserted between the AlN layer and the base. The evaluation of the crystallinity of the AlN layer was as follows: the X-ray rocking curve FWHM for the (0002) plane was 70 seconds; and the X-ray rocking curve FWHM for the (10-12) plane was 1100 seconds. The dislocation density of the AlN layer was $2\times10^{10}/cm^2$. The X-ray rocking curve measurement was made using an open slit by an ω scan process. This is to measure the tilt component of crystal orientation fluctuations from the c-axis of AlN when the (0002) plane is used, and to principally measure the twist component of the crystal orientation fluctuations about the c-axis of AlN when the (10-12) plane is used. FIG. 2 shows an AFM (Atomic Force Microscope) image of each of the epitaxial substrates 10. The surface roughness (ra) in a 5-by5-μm square region by the AFM measurement was not more than 3 Å. Steps at the atomic level were observed but a large number of pits in the surface were observed in the AFM image.

Next, the epitaxial substrates 10 were placed in a predetermined position within a reaction chamber of a heat treatment furnace. A nitrogen gas was supplied into the reaction chamber while the reaction chamber was maintained at 1 atm, and heat treatment was performed. The heat treatment was performed on the three epitaxial substrates 10 for two hours under the following different conditions: (a) at a temperature of 1650° C.; (b) at a temperature of 1550° C.; and (c) at a temperature of 1450° C., respectively.

Figure 3:
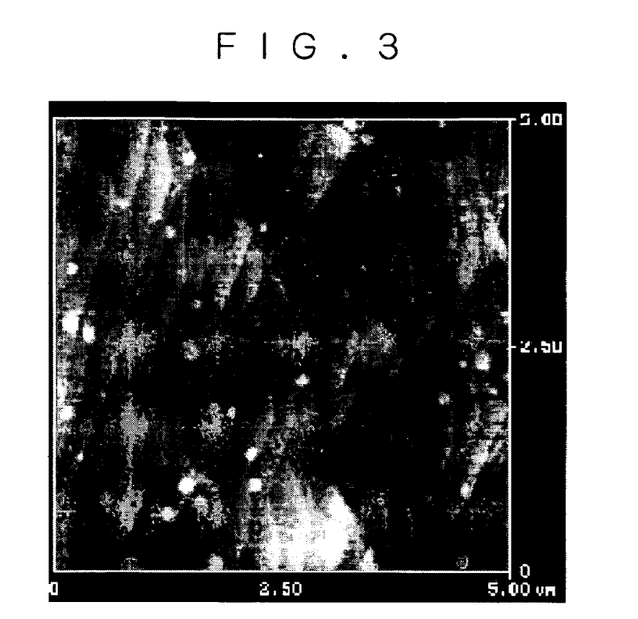
FIG. 3 shows the surface of the epitaxial substrate after the heat treatment according to Inventive Example 1.

The evaluation of the crystal quality of the AlN layer after the above-mentioned heat treatment under all of the conditions (a) to (c) was as follows: the X-ray rocking curve FWHM for the (0002) plane was 70 seconds; and the X-ray rocking curve FWHM for the (10-12) plane was 700 seconds. The dislocation density of the AlN layer was $5 \times 10^9 / cm^2$ under all of the conditions (a) to (c). FIG. 3 shows an AFM image of the epitaxial substrate 10 subjected to the heat treatment under the condition (a), that is, at a temperature of 1650° C. The surface roughness (ra) in a 5-by5-μm square region by the AFM measurement was not more than 3 Å. Steps at the atomic level were clearly observed, and no pits were observed in the AFM image. No pits were observed in AFM images obtained under the conditions (b) and (c) although not shown. The surface roughness (ra) under the condition (b) was similar to that under the condition (a), but the surface roughness (ra) under the condition (c) became remarkably worse.

Inventive Example 2

Figure 4:
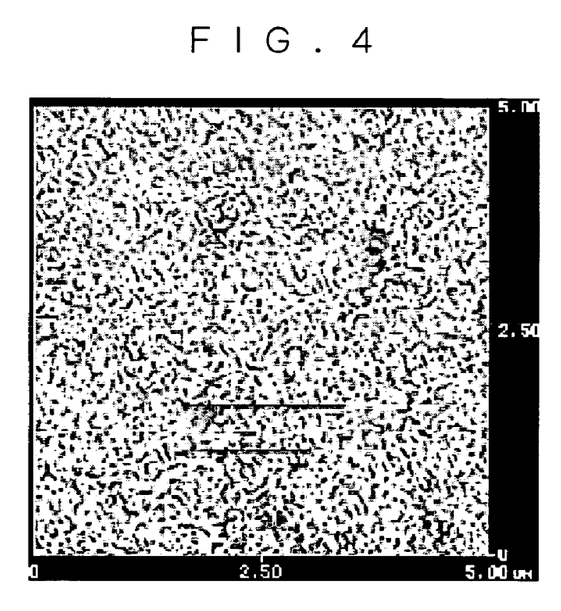
FIG. 4 shows a surface of an epitaxial substrate before heat treatment according to Inventive Example 2.

In Inventive Example 2, three epitaxial substrates 10 were obtained each by forming a (0001) AlN layer as the upper layer 2 having a thickness of 0.2 μm on (0001) sapphire as the base 1 at a temperature of 1200° C. by a MOCVD process. A base nitride layer is inserted between the AlN layer and the base. The evaluation of the crystallinity of the AlN layer was as follows: the X-ray rocking curve FWHM for the (0002) plane was 90 seconds; and the X-ray rocking curve FWHM for the (10-12) plane was 2000 seconds. The dislocation density of the AlN layer was $5 \times 10^{10} / cm^2$. FIG. 4 shows an AFM image of each of the epitaxial substrates 10. The surface roughness (ra) in a 5-by5-μm square region by the AFM measurement was 10 to 50 Å. A large number of pits in the surface were observed in the AFM image.

Next, the epitaxial substrates 10 were placed in a predetermined position within the reaction chamber of the heat treatment furnace. A nitrogen gas was supplied into the reaction chamber while the reaction chamber was maintained at 1 atm, and heat treatment was performed. The heat treatment was performed on the three epitaxial substrates 10 for two hours under the following different conditions: (a) at a temperature of 1650° C.; (b) at a temperature of 1550° C.; and (c) at a temperature of 1450° C., respectively.

The evaluation of the crystal quality of the AlN layer after the above-mentioned heat treatment showed different results depending on the heat treatment temperatures.

Figure 5:
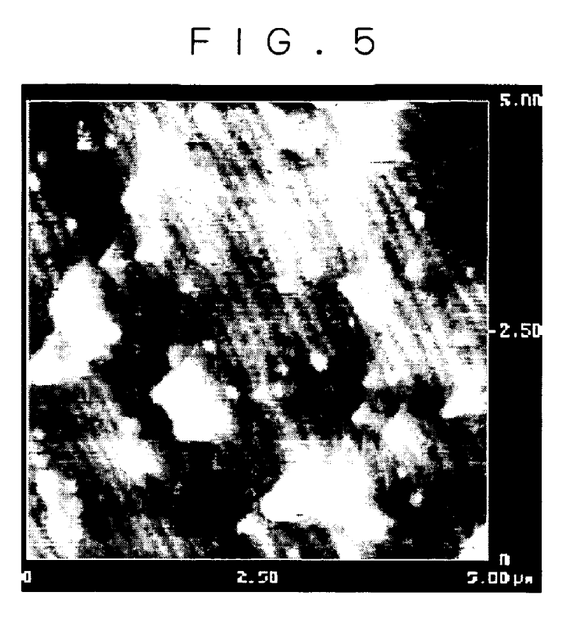
FIG. 5 shows the surface of the epitaxial substrate after the heat treatment according to Inventive Example 2.

Under the condition (a), the X-ray rocking curve FWHM for the (0002) plane was 150 seconds; and the X-ray rocking curve FWHM for the (10-12) plane was 750 seconds. The dislocation density of the AlN layer was $5 \times 10^9 / cm^2$. FIG. 5 shows an AFM image of the epitaxial substrate 10 in the case where the (0001) sapphire was used for the base 1. The surface roughness (ra) in a 5-by5-μm square region by the AFM measurement was not more than 3 Å. Steps at the atomic level were clearly observed, and no pits were observed in the AFM image.

Under the conditions (b) and (c), on the other hand, the dislocation density after the heat treatment was decreased as compared with the dislocation density before the heat treatment, but the surface roughness after the heat treatment was unchanged or rather became worse.

Regarding Inventive Examples 1 and 2

As illustrated in Inventive Examples 1 and 2, it was ascertained that the heat treatment at a temperature of not less than 1600° C. reduced the Al dislocation density to not more than one-half and, in addition, significantly reduced the number of pits, thereby to produce the effect of improving the crystal quality such as reduction in the number of dislocations and surface planarization. A remarkable γ-ALON layer was not ascertained in Inventive Examples 1 and 2. Additionally, it was ascertained that the heat treatment at a temperature of not less than 1500° C. produced a similar effect when the AlN layer was as thick as 1.0 μm.

Inventive Example 3

In Inventive Example 3, three epitaxial substrates 10 under the conditions (a) to (c) of different crystal qualities were obtained each by forming a (0001) AlN layer as the upper layer 2 having a thickness of 1.0 μm on (0001) sapphire as the base 1 by a MOCVD process. A base nitride layer is inserted between the AlN layer and the base. Although not shown, a large number of pits in the surface were observed in AFM images of the respective epitaxial substrates 10 in a similar manner to FIG. 2.

Next, the epitaxial substrates 10 were placed in a predetermined position within the reaction chamber of the heat treatment furnace. A nitrogen gas was supplied into the reaction chamber while the reaction chamber was maintained at 1 atm. In this state, heat treatment was performed at a temperature of 1650° C. for 15 hours.

The evaluation of the crystal quality of the AlN layer after the above-mentioned heat treatment was as follows: under the condition (a), the X-ray rocking curve FWHM for the (0002) plane was 70 seconds, and the X-ray rocking curve FWHM for the (10-12) plane was 350 seconds. The dislocation density of the AlN layer was $9 \times 10^8 / cm^2$. The surface roughness (ra) in a 5-by5-μm square region by the AFM measurement was not more than 3 Å. Steps at the atomic level were clearly observed, and no pits were observed in the AFM image in a similar manner to FIG. 3. Similar results were obtained under the condition (b). No changes were found under the condition (c) before and after the heat treatment.

Thus, the use of AlN having a lower dislocation density for the epitaxial substrate achieves a layer of AlN having a lower dislocation density. It was ascertained, on the other hand, that the poor crystal quality before the heat treatment such as that under the condition (c) resulted in the crystal quality not improved by the heat treatment under the same heat treatment conditions.

Figure 8:
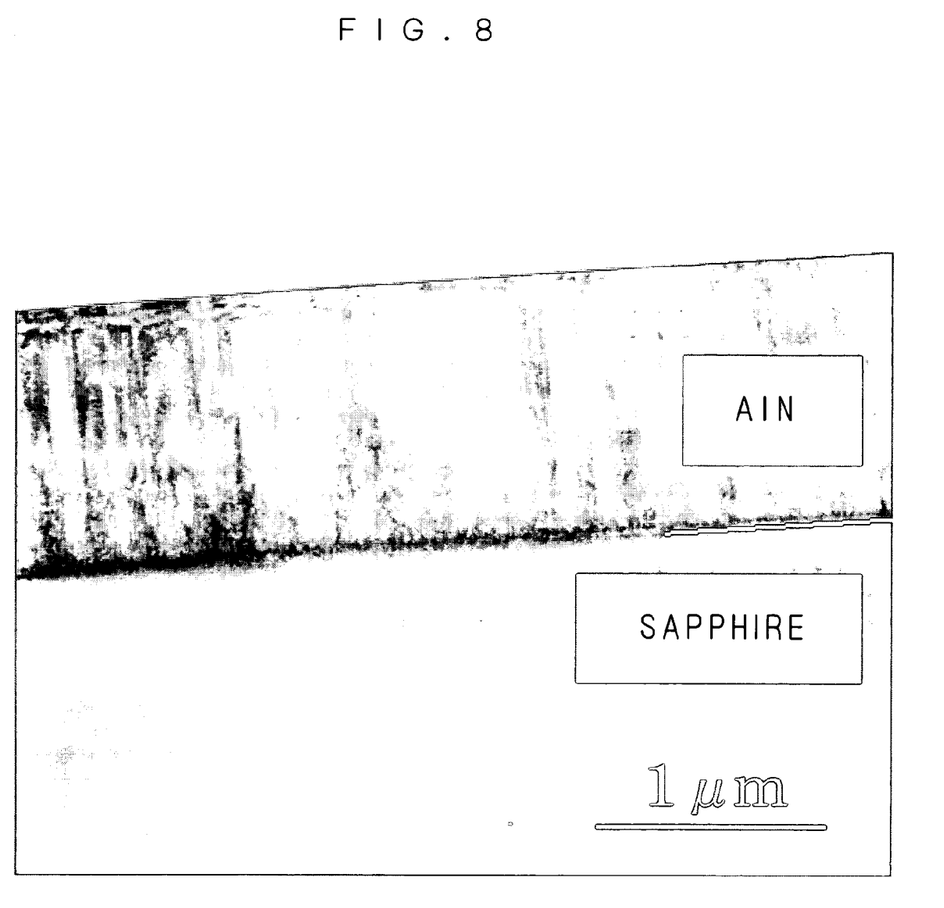
FIG. 8 shows a sectional TEM image of an epitaxial substrate under condition (a) observed before heat treatment in Inventive Example 3.

FIG. 8 shows a sectional TEM image (bright field image) of the epitaxial substrate 10 under the condition (a) before the heat treatment. In FIG. 8, the dislocations in AlN serving as the upper layer 2 are observed as black lines, which are especially greater in number near the interface with sapphire serving as the base 1 and decreases in an upward direction.

Figure 9:
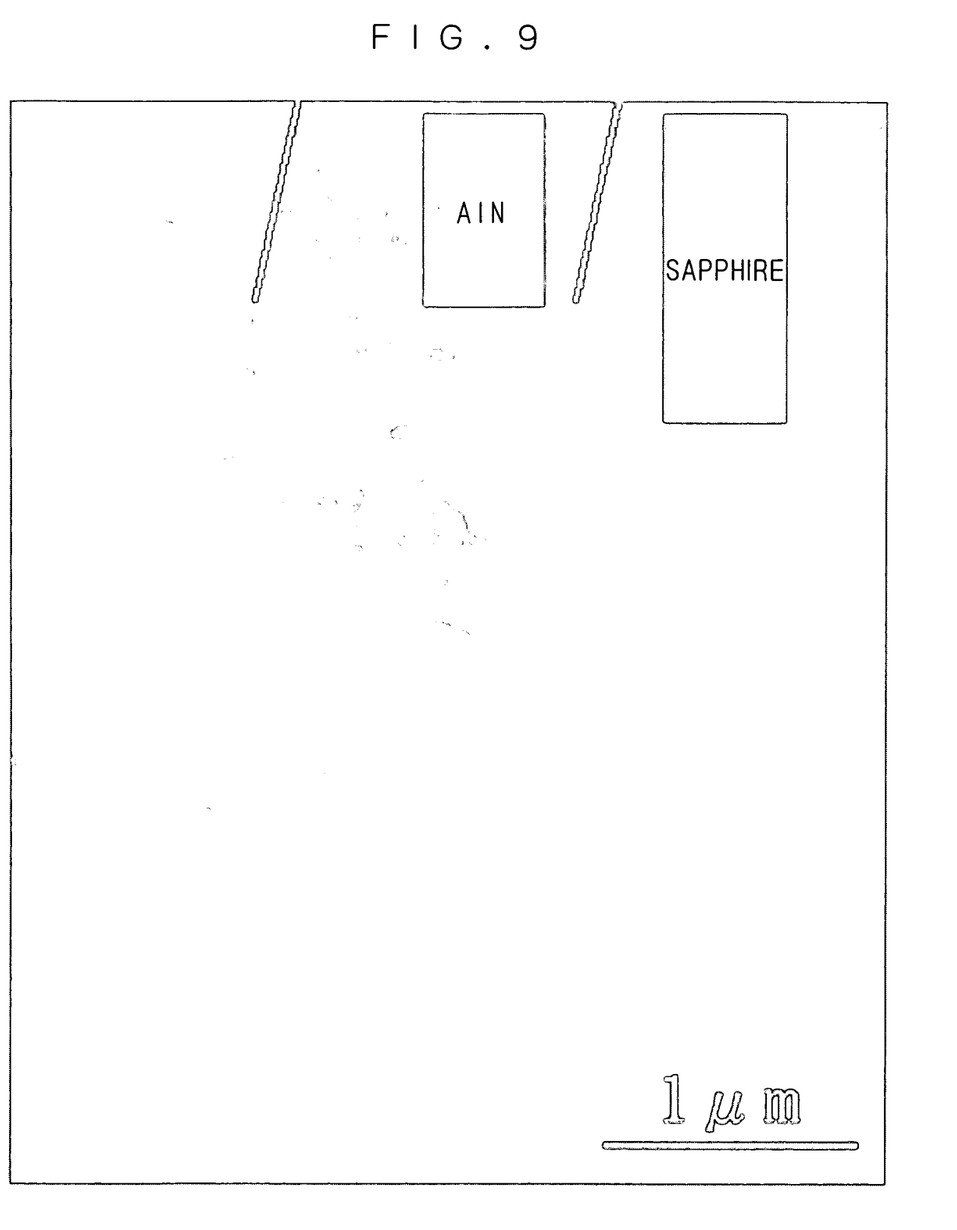
FIG. 9 shows a sectional TEM image of the epitaxial substrate under the condition (a) observed after the heat treatment in Inventive Example 3.

FIG. 9 shows a sectional TEM image (dark field image) of the epitaxial substrate 10 under the condition (a) after the heat treatment. In FIG. 9, the dislocations in the upper layer 2 are observed as white lines. A comparison with FIG. 8 shows that fewer dislocations are observed near the interface in FIG. 9 than in FIG. 8.

Comparative Example 1

Comparative Example 1 was similar to Inventive Examples 1 and 2 in preparing the epitaxial substrates and in performing heat treatment on the epitaxial substrates except that the heat treatment temperature was 1200° C.

The evaluation of the crystal quality of the AlN layer showed that no changes in the crystal quality were observed before and after the above-mentioned heat treatment.

Comparative Example 2

Comparative Example 2 was similar to Inventive Examples 1 and 2 in preparing the epitaxial substrates employing sapphire substrates and in performing heat treatment on the epitaxial substrates except that the heat treatment temperature was 1750° C.

Figure 6:
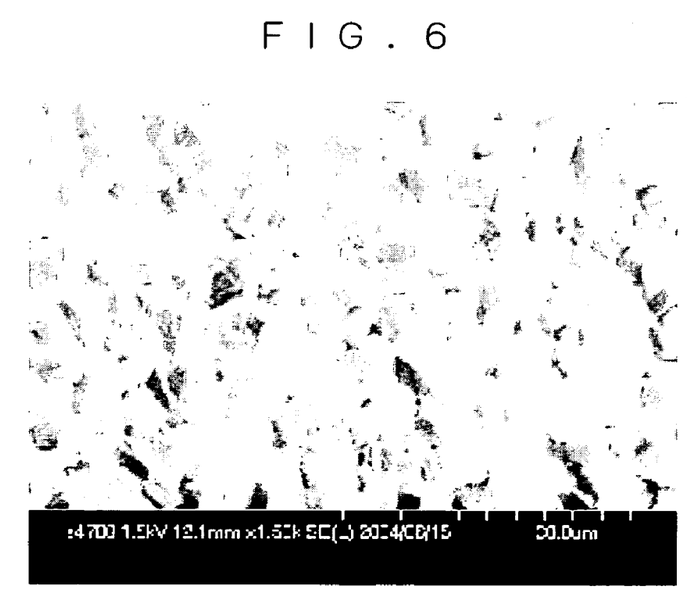
FIG. 6 shows a surface of an epitaxial substrate after heat treatment according to Comparative Example 2.

The evaluation of the crystal quality of the AlN layer after the heat treatment showed that a γ-ALON layer was present together with the AlN layer and that the surface roughness (ra) in a 5-by5-μm square region by the AFM measurement was not less than 50 nm. The X-ray rocking curve FWHM for the (0002) plane was not less than 500 seconds; and the X-ray rocking curve FWHM for the (10-12) plane was not less than 3000 seconds. FIG. 6 shows a SEM image of the surface of each of the epitaxial substrates after the above-mentioned heat treatment. Asperities are clearly observed in the SEM image of FIG. 6.

Regarding Comparative Examples 1 and 2

As illustrated in Comparative Example 1, the effect of improving the crystal quality such as reduction in the number of dislocations and surface planarization was not ascertained when the heat treatment temperature was as low as 1200° C. As illustrated in Comparative Example 2, the deterioration of the crystal quality was ascertained after the heat treatment in which γ-ALON was remarkably formed even if the heat treatment is performed at an elevated temperature of not less than 1500° C.

While the invention has been described in detail, the foregoing description is in all aspects illustrative and not restrictive. It is understood that numerous other modifications and variations can be devised without departing from the scope of the invention.

What is claimed is:

1. A substrate for epitaxial growth, comprising:
a predetermined single crystal base; and
an upper layer made of a group-III nitride crystal epitaxially formed on said single crystal base,
said substrate for epitaxial growth being subjected to a heating process after the formation of said upper layer, said heating process being performed at a heating temperature higher than a temperature at which said group-III nitride crystal is formed, wherein the surface roughness of said upper layer after said heating process is not more than 3 Å, wherein the surface of said upper layer after said heating process is substantially free of pits,
wherein said group-III nitride crystal has a main surface substantially coincident with a (0001) plane, and
wherein the dislocation density of said upper layer after said heating process is not more than $5 \times 10^9/\text{cm}^2$.

2. The substrate for epitaxial growth according to claim 1, wherein said heating temperature is not less than 1250° C.

3. The substrate for epitaxial growth according to claim 2, wherein said heating temperature is not less than 1500° C.

4. The substrate for epitaxial growth according to claim 3, wherein said heating temperature is not less than 1600° C.

5. The substrate for epitaxial growth according to claim 1, wherein
said heating process is performed in an atmosphere containing element nitrogen.

6. The substrate for epitaxial growth according to claim 1, wherein
a reaction product of said single crystal base and said group-III nitride crystal is not formed by said heating process.

7. The substrate for epitaxial growth according to claim 1, wherein
said group-III nitride crystal has an Al content of not less than 80 mole percent of all of the group-III elements.

8. The substrate for epitaxial growth according to claim 7, wherein said group-III nitride crystal is AlN.

9. The substrate for epitaxial growth according to claim 1, wherein the upper layer made of said group-III nitride crystal is formed directly on said single crystal base.

10. A semiconductor device comprising:
a) a substrate for epitaxial growth including
a-1) a predetermined single crystal base, and
a-2) an upper layer made of a first group-III nitride crystal epitaxially formed on said single crystal base; and
b) a semiconductor layer made of a second group-III nitride crystal,
said substrate for epitaxial growth being subjected to a heating process after the formation of said upper layer, said heating process being performed at a heating temperature higher than a temperature at which said first group-III nitride crystal is formed,
wherein the surface roughness of said upper layer after said heating process is not more than 3 Å,
wherein a lattice constant in a main surface of said second group-III nitride crystal is not less than a lattice constant in a main surface of said first group-III nitride crystal,
wherein the surface of said upper layer after said heating process is substantially free of pits,
wherein said first group-III nitride crystal has a main surface substantially coincident with a (0001) plane, and
wherein the dislocation density of said upper layer after said heating process is not more than $5 \times 10^9/\text{cm}^2$.

11. The semiconductor device of claim 10, wherein the upper layer made of said first group-III nitride crystal is formed directly on said predetermined single crystal base.

* * * * *